(12) United States Patent
Riemenschneider et al.

(10) Patent No.: US 10,322,638 B2
(45) Date of Patent: Jun. 18, 2019

(54) MEASURING TRANSDUCER

(71) Applicants: Holger Riemenschneider, Dortmund (DE); Stephan Cater, Dortmund (DE); Jürgen Waffner, Essen (DE)

(72) Inventors: Holger Riemenschneider, Dortmund (DE); Stephan Cater, Dortmund (DE); Jürgen Waffner, Essen (DE)

(73) Assignee: innogy SE, Essen (DE)

( * ) Notice: Subject to any disclaimer, the term of this patent is extended or adjusted under 35 U.S.C. 154(b) by 0 days.

(21) Appl. No.: 16/115,776

(22) Filed: Aug. 29, 2018

(65) Prior Publication Data

US 2018/0370380 A1 Dec. 27, 2018

Related U.S. Application Data

(63) Continuation of application No. PCT/EP2016/075758, filed on Oct. 26, 2016.

(30) Foreign Application Priority Data

Feb. 29, 2016 (DE) .................. 10 2016 103 556

(51) Int. Cl.
*G01R 22/10* (2006.01)
*B60L 11/18* (2006.01)
*B60L 3/00* (2019.01)
*G01R 11/38* (2006.01)

(52) U.S. Cl.
CPC ......... *B60L 11/1848* (2013.01); *B60L 3/0046* (2013.01); *G01R 11/38* (2013.01); *G01R 22/10* (2013.01); *Y02T 10/7005* (2013.01); *Y02T 10/7072* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 30/14* (2013.01)

(58) Field of Classification Search
CPC ...... G01R 33/26; G01R 31/36; G01R 31/371; G01R 35/00; G01R 1/203; G01R 31/04; G01R 31/3644; G01R 31/387; G01R 11/38; G01R 22/10; B60L 11/1848; B60L 3/0046
(Continued)

(56) References Cited

U.S. PATENT DOCUMENTS 3,569,829 A * 3/1971 Griffey .................. G01R 31/02
307/108
4,341,994 A 7/1982 Kawasaki et al.
(Continued)

FOREIGN PATENT DOCUMENTS

DE 10 2013 217 191 A1 3/2015
EP 2 947 743 A2 11/2015

*Primary Examiner* — Jermele M Hollington
*Assistant Examiner* — Taqi R Nasir
(74) *Attorney, Agent, or Firm* — Reinhart Boerner Van Deuren P.C.

(57) ABSTRACT

The invention relates to a measuring transducer for charging stations of electric vehicles. In the measuring transducer, a measuring device is connected to a direct current charging circuit for detecting at least one direct current measurement variable. A transducer for converting the direct current measurement variable into an alternating current actuating variable is provided, and the measuring transducer also includes an actuating means for adjusting at least one alternating current variable in an alternating current measuring circuit as a function of the alternating current actuating variable.

16 Claims, 3 Drawing Sheets

(58) Field of Classification Search
USPC ............... 324/426, 430, 432, 433, 434, 450,
324/760.01, 305, 137, 136, 138, 139, 164,
324/222; 320/128, 107, 104, 131, 21, 36,
320/40, 43, 39; 307/64, 65, 108, 116, 87,
307/84, 127, 85
See application file for complete search history.

(56) References Cited

U.S. PATENT DOCUMENTS

| | | | | |
|---|---|---|---|---|
| 4,885,523 | A * | 12/1989 | Koenck | H01M 2/1055 |
| | | | | 320/131 |
| 5,574,362 | A | 11/1996 | Fiorina et al. | |
| 6,211,681 | B1 * | 4/2001 | Kagawa | B60K 6/46 |
| | | | | 324/426 |
| 6,861,842 | B2 * | 3/2005 | Baeuerlein | G01R 31/389 |
| | | | | 324/426 |
| 2005/0151559 | A1 * | 7/2005 | Liao | G01R 31/025 |
| | | | | 307/64 |
| 2006/0013790 | A1 * | 1/2006 | Shimizu | A61K 8/8111 |
| | | | | 424/70.12 |
| 2006/0028178 | A1 * | 2/2006 | Hobbs | B60L 3/0046 |
| | | | | 320/128 |
| 2011/0238341 | A1 | 9/2011 | Etezadi-Amoli et al. | |
| 2013/0335012 | A1 * | 12/2013 | Meyer | H02J 7/0004 |
| | | | | 320/107 |

* cited by examiner

MEASURING TRANSDUCER

CROSS-REFERENCE TO RELATED PATENT APPLICATIONS

This patent application is a continuation of PCT Application No. PCT/EP2016/075758, filed Oct. 26, 2016, which claims priority to German Application No. 10 2016 103 556.4, filed Feb. 29, 2016, the entire teachings and disclosure of which are incorporated herein by reference thereto.

FIELD

The subject matter relates to a measuring transducer for charging stations of electric vehicles and to a method for operating a measuring transducer.

BACKGROUND

The increasing use of electric charging stations for electric vehicles is presenting new challenges with regard to the measurement technology to be employed. Particular technical challenges relate to the correct billing of electrical energy obtained. Apart from the charging of electric vehicles by means of alternating current, wide use is also made of charging with direct current. However, when charging by means of direct current, the problem arises that the measurement technology necessary for billing the electrical energy obtained is not available on the same scale as alternating current measurement technology. In particular, energy meters authorised under the calibration regulations as consumption volume meters are generally alternating current meters. These are also widely used as energy meters in homes and the like and are thus available in larger quantities at inexpensive prices. This is not the case with direct current measurement technology, where due to the lower quantities the costs for corresponding measuring devices are considerably higher.

For this reason, the problem for the subject matter was to provide reliable measurement technology available in large quantities for direct current charging stations.

BRIEF SUMMARY

This problem is solved according to the subject matter in that electrical power made available via a direct current charging station is measured for billing purposes in an alternating current measuring circuit with alternating current measurement technology. To this end, the measuring transducer to begin with comprises a measuring device that can be connected to a direct current charging circuit for detecting at least one direct current measurement variable. A direct current charging circuit can in this case be understood to be the electrical charging circuit, to which an energy store of an electric vehicle is connected. Via this direct current charging circuit, the charging station delivers electrical energy to the electric vehicle. For grid stabilisation a return feed from the vehicle to the grid via the charging station can take place. The following description thus relates to both options, with only a change in sign of the current flow direction taking place here.

Via the direct current charging circuit, a direct current with a certain current strength is obtained by a charge controller of an electric vehicle. The electric vehicle thus obtains electrical energy corresponding to the product of the current, voltage and time. Possible direct current measurement variables can in particular be the direct current and the current strength in the direct current charging circuit.

To now be able to bill the electrical energy delivered to the electric vehicle via the direct current charging circuit, this must be measured in a suitable energy meter. However, energy meters for direct current circuits are not produced on a large scale and are generally not authorised under the calibration regulations. When commercial charging stations are used, however, the billing of the electrical energy made available must also be compliant with the calibration regulations. The measuring devices used must meet all technical calibration requirements.

To satisfy these requirements, the inventors realised that it is possible to measure the electrical energy made available in the direct current charging circuit in an alternating current measuring circuit, wherein in particular, in the alternating current measuring circuit an electrical energy is used, which is significantly lower than the electrical energy made available in the direct current charging circuit, but the conversion factor is constant.

To this end, the inventors propose a transducer for converting the direct current measurement variable into an alternating current measurement variable. With the help of the transducer, it is possible to convert the direct current measurement variable measured in the direct current charging circuit into an actuating variable, with which an alternating current measuring circuit is operated.

The alternating current measurement variable output by the transducer is used according to the subject matter to operate an actuating means, which adjusts an alternating current variable in an alternating current measuring circuit as a function of the alternating current actuating variable.

Through suitable scaling of the direct current measurement variable in relation to the alternating current actuating variable, it is possible to model the alternating current variable, in particular the active power, measured in the alternating current measuring circuit, so that it is lower by a constant factor than the active power that is made available via the direct current charging circuit in the electric vehicle. Conversion factors of 1,000 or 5,000 are perfectly conceivable. Suitable alternating current measuring devices are available which perform appropriate upscaling and output the measured electrical active power in the alternating current measuring circuit multiplied by the known factor as measured electrical power, or taking account of time, as electrical energy.

First it is necessary to convert the direct current measurement variable into an alternating current measurement variable. To this end a transducer is proposed, which adjusts the alternating current actuating variable at least as a function of the direct current measurement variable. The transducer generally has a constant conversion factor, by way of example a conversion factor corresponding to the alternating current measuring device. Depending on how the conversion in the alternating current measuring device takes place, an adjustment of the alternating current measurement variable as a function of the direct current measurement variable can take place.

According to an exemplary embodiment, it is proposed that the transducer is configured such that the value of the alternating current actuating variable is less by at least a factor of ten than the value of the direct current measurement variable. However, factors of more than 100, by way of example 1,000 or even 5,000, are preferred. Suitable alternating current measuring devices are available which multiply the measured alternating current variable by an appropriate factor. Thus, at the alternating current measuring device, the output of the measured value corresponds to the direct current measurement variable, although a downscaling from the direct current measurement variable to the alternating current actuating variable has first taken place. This is suitably compensated in the alternating current measuring device.

According to an exemplary embodiment, it is proposed that the direct current measurement variable comprises at least one direct voltage and/or one direct current. In particular, the direct current measurement variable is a function of the direct voltage and/or the direct current in the direct current charging circuit. The direct current measurement variable can be derived from the direct voltage and/or the direct current, measured in the direct current charging circuit.

In particular, it is proposed that the direct current measurement variable is an electrical power. The electrical power is generally determined from the electrical voltage and the electrical current in the direct current charging circuit. If the direct current measurement variable is detected at short intervals, then the alternating current actuating variable can be tracked in likewise correspondingly small intervals. Here, the alternating current actuating variable is preferably an electrical power, in particular an electrical active power. In the alternating current measuring circuit, preferably only active power is used. This can be achieved in that in the alternating current measuring circuit parasitic, capacitive or inductive loads are minimised as far as possible and in the alternating current measuring circuit only an ohmic resistance is provided. According to the subject matter, the electrical active power is preferably lower by a factor than the electrical power in the direct current charging circuit. These factors are preferably 10, 100, 1,000, 5,000 or similar.

In the alternating current measuring circuit, an alternating current energy meter is installed, which measures the electrical energy used in the alternating current measuring circuit. Such a meter is preferably a Ferraris meter or a smart meter. Such a smart meter can preferably be read remotely, so that the electrical energy measured in the alternating current measuring circuit can be read out remotely via a billing centre.

The direct current measurement variable, in particular the direct current in the direct current charging circuit, is detected via an ohmic resistor, in particular a measuring resistor. This measuring resistor is subject to temperature fluctuations, so that the current strength measured via the voltage drop determined across the measuring resistor, is temperature dependent. To be able to perform a temperature compensation in the alternating current measuring circuit, apart from the direct current measurement variables, preferably, according to an exemplary embodiment, a temperature in the direct current charging circuit is also detected. The temperature is preferably detected via a temperature sensor. The temperature sensor is arranged on the direct current charging circuit. In particular, the temperature sensor is arranged directly on the measuring resistor in the direct current charging circuit and thus detects the temperature of the measuring resistor. The alternating current actuating variable is then also determined as a function of the measured temperature of the temperature sensor.

It is in particular possible to make available the current strength of the direct current charging circuit, determined on the basis of the voltage drop across the measuring resistor in a temperature-compensated manner. It is thus possible, to determine the direct current and the direct voltage in the direct current charging circuit independent of temperature in order to thus be able to determine the alternating current actuating variable independent of temperature.

Since fluctuations in the alternating voltage can also occur in the alternating current circuit, in particular due to mains fluctuations, it can arise that when adjusting a resistance in the measuring circuit due to a changing mains voltage the active power measured by the measuring device varies and in particular is no longer lower by the predetermined factor than the electrical power in the direct current charging circuit.

To allow synchronism of the active power in the alternating current measuring circuit and the electric power in the direct current charging circuit, a measurement can take place in the alternating current measuring circuit of both the alternating voltage and the alternating current. During this measurement, the phase angle between the alternating current and the alternating voltage can also be determined. Information derived therefrom on an active power in the alternating current measuring circuit can be fed back to the transducer and serve there as a reset to the reference variable of the direct current measurement variable, for adjusting the alternating current actuating variable. The alternating current variables measured in the alternating current measuring circuit can be fed back jointly or also independently of one another to the transducer, to thereby allow a regulation of the alternating current actuating variable.

The measured direct current measurement variable, in particular the direct voltage and also the direct current, can first be scaled in a scaler in order, by way of example, to be fed to an analogue-digital transducer. The analogue-digital transducer generally has a limited resolution. To prevent errors due to inaccurate quantisation, it is proposed that, via an operational amplifier to begin with a scaling of the current measurement variables is carried out in order to reduce their value dynamics, in particular the amplitude of the measured values.

To allow the most precise possible measurement in the alternating current measuring circuit of the alternating current power, it is proposed that in the alternating current measuring circuit a constant current source is provided. The constant current source is adjusted as a function of the alternating current actuation variable. Through the constant current source, a constant alternating current flows into the alternating current measuring circuit, which together with the alternating voltage is measured in the measuring device and thus an active power or, taking into consideration the time, an active energy is measured.

The constant current source is preferably an adjustable resistor or has such an adjustable resistor. With the help of the adjustable resistor it is possible to adjust the current flow in the alternating current measuring circuit.

As an example, the alternating current measuring circuit can be connected on the mains side to a 230 V grid. By suitable adjustments of the resistance a current flow in the alternating current measuring circuit can by way of example be 200 milliamps. When there is phase coincidence, therefore an active power of 46 W results in the alternating current measuring circuit. This active power is measured by the alternating current measuring device and an active energy output.

An active power of 46 W, for a factor of 1,000, as can be set in the transducer, can correspond to a direct current power in the direct current charging circuit of 46 KW. This means that if an electric vehicle charges at 46 KW, accordingly in the alternating current measuring circuit only 46 W of "measuring service" is used. A higher factor leads to an even lower use of "measuring service" in the alternating current measuring circuit, thereby increasing the efficiency of the measuring transducer.

According to an exemplary embodiment, it is proposed that the transducer adjusts the alternating current actuating variable such that the electrical active power in the alternating current circuit is lower by a constant factor than the electrical power in the direct current charging circuit. The factor is, as mentioned, preferably greater than 100, in particular at 1,000 or 5,000. The factor can in particular be a function of the kind of energy meter in the alternating current measuring circuit. If an energy meter with a factor of 5,000 is used, the factor for the transducer can accordingly also be set at 5,000.

In order to keep the electrical power in the measuring circuit as low as possible, it is proposed that the alternating current measuring circuit is a single-phase alternating current measuring circuit.

A further aspect is a method for operating a measuring transducer, in particular according to one of the above claims, in which in a direct current charging circuit at least one direct current measurement variable is measured, from the direct current measurement variable an alternating current actuating variable is determined and an alternating current measuring circuit is operated with an alternating current variable as a function of the alternating current actuating variable.

The method can be implemented particularly easily, if the alternating current measuring circuit has a mains connection and is operated with mains voltage. This mains voltage is in particular dependent upon the respective network operator and/or operator country and here can, by way of example, be 230 V or also 110 V AC.

The direct current measurement variable is preferably detected in short intervals, to be able in this way to map the detected instantaneous electrical power with the greatest possible time accuracy. Only then is the measured electrical energy also the most accurate reflection of the electrical energy made available. For this reason, it is proposed that the intervals are less than one second, preferably less than 100 ms, in particular 10 ms.

BRIEF DESCRIPTION OF THE DRAWINGS

In the following, the subject matter is explained in more detail using a drawing showing exemplary embodiments. The drawing shows as follows.

DETAILED DESCRIPTION

Figure 1:
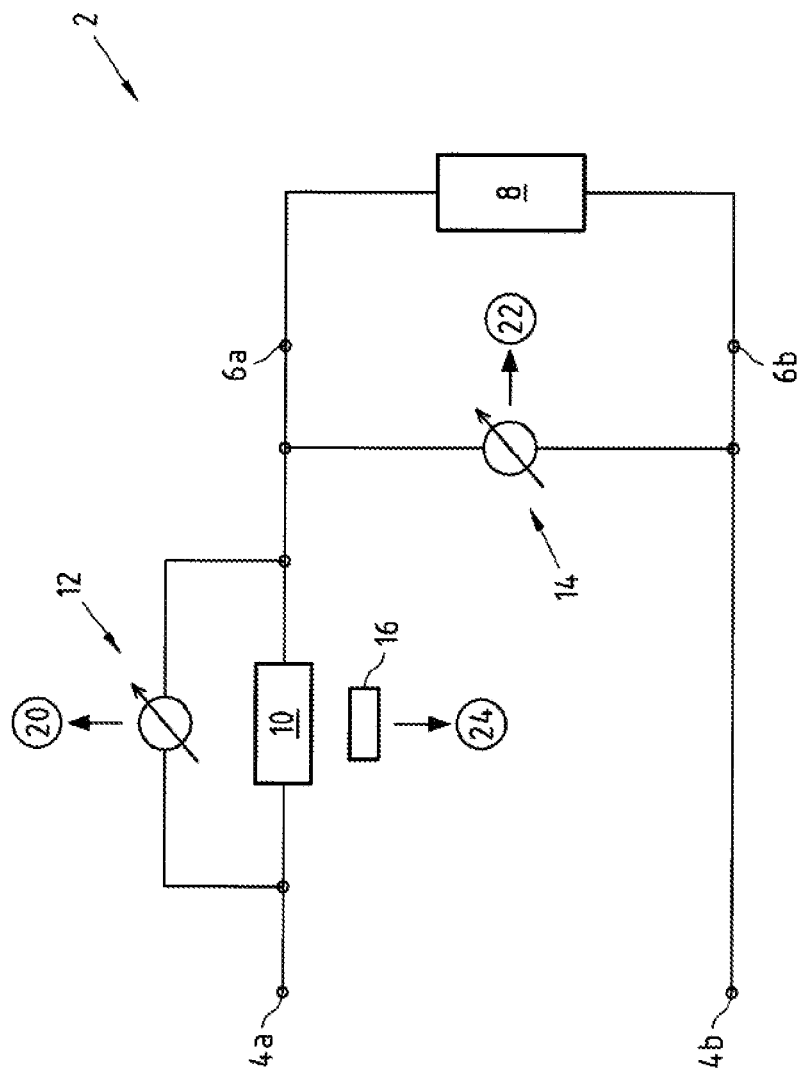
FIG. 1 is a direct current charging circuit.

FIG. 1 shows a direct current charging circuit 2. The direct current charging circuit 2 is fed via a rectifier (not shown) with direct voltage at its connections 4a, 4b. The direct current charging circuit is generally designed for powers of more than 10 kW, preferably more than 40 kW, in particular more than 70 kW of electrical power.

Via charging contacts 6a, 6b an electric vehicle 8 can be connected to the direct current charging circuit 2. The direct current charging circuit 2 is generally installed in a charging station, which via a suitable plug contact can be connected to an electric vehicle 8. The direct current charging circuit 2 is shown, for the purposes of clarity, with just the relevant measurement devices necessary for the measuring transducer that is the subject matter. The direct current charging circuit of an electric vehicle 8 naturally requires further technical devices which, for the sake of clarity, are not shown here, though.

In the direct current charging circuit 2, a measuring resistor 10 is provided. The measuring resistor 10 is generally a measuring shunt, which as far as possible has a constant current/voltage behaviour across a broad range of temperatures. The measuring shunt can for example be made from Manganin.

The falling voltage is measured across the measuring resistor 10 with a voltmeter 12. From this voltage value, the current strength in the direct current charging circuit can be derived, if both temperature and the current-voltage curve of the measuring resistor 10 are known.

Firstly, a direct current measured value 20 derived from the voltage measured on the voltmeter 12 is output.

A direct current between the charging contacts 6a, 6b is measured via the voltmeter 14 and the measured direct current is output as a direct current measured value 22.

Furthermore, a temperature sensor 16 is provided, which is preferably arranged directly on the measuring resistor 10 and thus preferably measures the temperature of the measuring resistor 10. The temperature sensor 16 outputs a temperature measured value 24.

Figure 2:
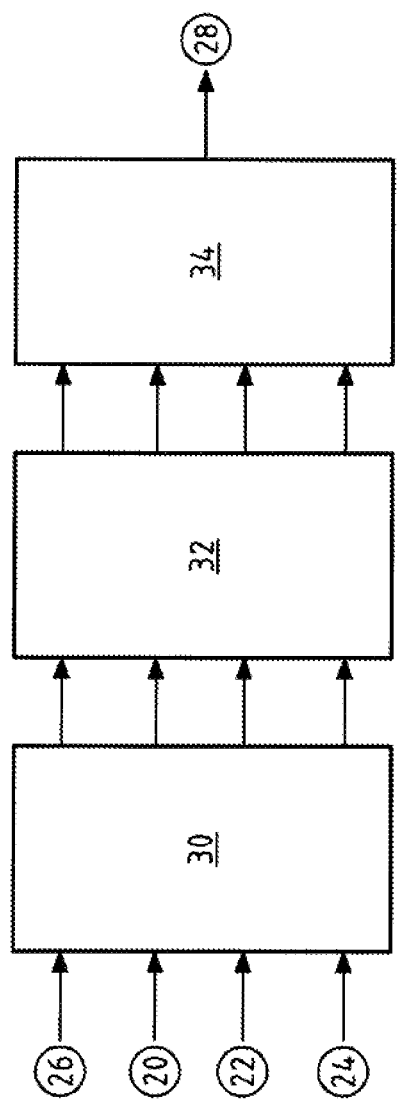
FIG. 2 is a transducer.

The measured values 20, 22, 24 measured in the direct current charging circuit 2 are then first fed to a scaling device 30, as shown in FIG. 2. In the scaling device 30 in particular the direct current measured value 20 and also the direct voltage measured value 22 are scaled, in order in particular to ensure a lower amplitude in terms of amount of the measured values. The scaling can take place for one, several or all measured values 20, 22, 24. Furthermore, the scaler is fed a power measured value 26, which is detected as described in the following.

All measured values 20, 22, 24, 26 are then fed to an analogue-digital transducer 32 and the now digitised measured values are then fed to a transducer 34. In the transducer the direct current measured values 20, 22 are converted as a function of the temperature measured value 24 and the fed-back power measured value 26 into an alternating current actuating value 28.

To begin with, the direct voltage measured value and the direct current measured value 20, 24 are used to determine an electrical power in the direct current charging circuit. Then, or prior to that, the temperature measured value 24 can be used to calculate from the direct current measured value a temperature drift. If the measuring resistor 10 does not have a constant current/voltage curve across the entire temperature range, then a temperature drift based on the temperature measured values 24 can be taken into account and thus from the voltage measured across the resistor 10 the actual current flowing in the direct current charging circuit 2 can be determined. The temperature-adjusted direct current power can then be determined in the direct current charging circuit 2.

As a function of a factor, by way of example 1,000, an alternating current actuating variable can be determined. The factor can, by way of example, be applied to the direct current power. If, by way of example, a direct current power of 1 kW results, the alternating current actuating variable for a factor of 1,000 becomes 1 W. A linear conversion of the direct current measurement variable to an alternating current actuating variable preferably takes place.

The alternating current actuating variable 28 is output on the transducer 34 and, by way of example, used to perform a conversion into an alternating current at a known alternating voltage.

Figure 3:
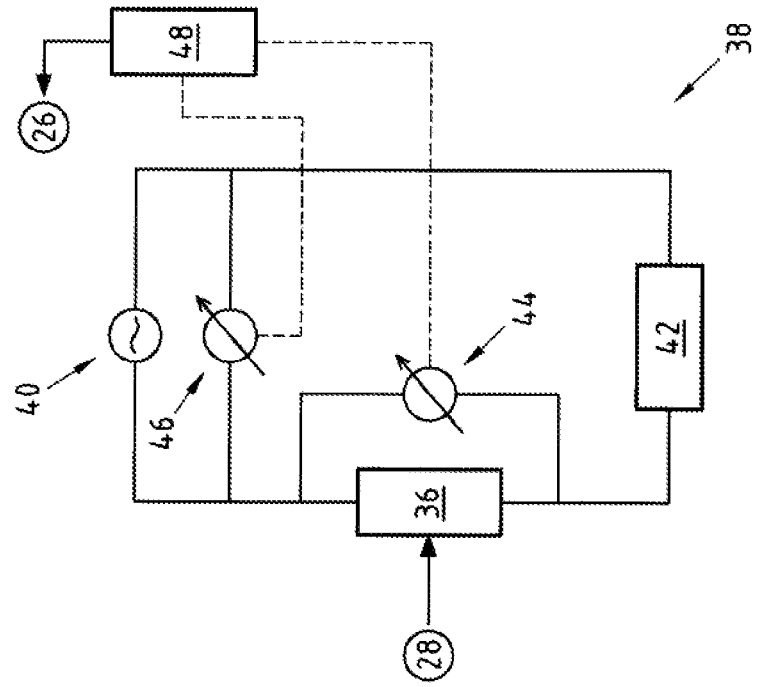
FIG. 3 is an alternating current measuring circuit.

The alternating current actuating variable 28 is, as shown in FIG. 3, fed to a constant current source 36. The constant current source 36 generally has an adjustable resistor. Via the resistor, the current across the constant current source 36 can be adjusted. The resistor, which is adjusted in the constant current source 36, is determined from the voltage in the alternating current measuring circuit 38 and the alternating current actuating variable. If, by way of example, the electrical power in the direct current charging circuit 2 is 23 kW for a factor of 1,000, in the transducer 34 an alternating current power of 23 W results. For an alternating voltage of 230 VAC the result, for a power factor cos phi of 1, is an alternating current variable of 0.1 ampere. This current strength leads to an adjustment of the resistor in the in the constant current source 36 to 2.3 kΩ. It should be mentioned that this is purely an example and depending on the factor and other boundary conditions the constant current source 36 can also be operated with other values.

The alternating current measuring circuit 38 is connected via a mains connection 40 to an electrical grid. The electrical grid in particular makes available a supply voltage of 230 V AC. The alternating current measuring circuit 38 is in particular a single-phase measuring circuit and apart from the constant current source 36 has an energy meter 42. The energy meter 42 detects in particular the electrical active power or active energy, used in the alternating current measuring circuit 38. In the abovementioned example this is by way of example a power of 23 W. If this drops constantly over an hour, that is to say if the vehicle by way of example charges constantly at 23 kW for an hour, and has thus obtained electrical energy of 23 kWh, the energy counter 42 measures 23 Wh. The measured value output, however, could be 23 kWh, if the energy meter 42 has a corresponding conversion factor of 1,000.

To check the active power used in the alternating current measuring circuit 38 in relation to the electric power in the direct current charging circuit 2, a current and a voltage in the alternating current charging circuit are detected. The current in the alternating current measuring circuit is preferably detected via a voltmeter 44, which measures the voltage drop across the constant current source 36. The alternating voltage is detected via a voltmeter 46. Furthermore, a phase angle between current and voltage can be detected. The measured values derived therefrom are fed to an evaluation circuit 48 and in the evaluation circuit, based on the measured values, the active power used in the current measuring circuit 38 is determined. This active power can be decoupled as a power measured value 26 and fed to the scaler 30 as shown in FIG. 2.

Finally, the active power 26 is fed to the transducer 34 and can be compared with the alternating current actuating variable. These two values must correspond, otherwise in the transducer 34 a control, in particular a P control, a PI control or a PID control can take place to achieve synchronism of the measured direct current measurement variable and the adjusted alternating current actuating variable.

With the help of the measuring transducer according to the subject matter, it is possible in a particularly easy and economical manner, to detect relevant measured values for billing purposes during direct current charging. No complicated direct current measurement technology is needed, as existing alternating current technology can be used to detect relevant values for billing.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A measuring transducer for charging stations of electric vehicles comprising:
   a measuring device that can be connected to a direct current charging circuit for detecting at least one direct current measurement variable;
   a transducer for converting the direct current measurement variable into an alternating current measurement variable;
   an actuating means for adjusting at least one alternating current variable in an alternating current circuit as a function of the alternating current actuating variable;
   wherein the alternating current circuit is an alternating current measuring circuit with alternating current measuring technology and wherein the active power in the alternating current measuring circuit is less by a constant factor than the power in the direct current charging circuit.

2. The measuring transducer according to claim 1, wherein the transducer adjusts the alternating current measurement variable at least as a function of the direct current measurement variable.

3. The measuring transducer according to claim 2, wherein the transducer is configured such that an absolute value of the alternating current actuating variable is less by at least a factor of ten than an absolute value of the direct current measurement variable.

4. The measuring transducer according to claim 1, wherein the at least one direct current measurement variable comprises at least one direct voltage and/or one direct current.

5. The measuring transducer according to claim 1, wherein the direct current measurement variable is an electrical power and in that the alternating current actuating variable is an electrical power, in particular an electrical active power.

6. The measuring transducer according to claim 1, wherein an alternating current measuring device, in particular an alternating current energy meter, in particular a Ferraris meter or a smart meter, is arranged in the alternating current measuring circuit.

7. The measuring transducer according to claim 1, wherein a temperature sensor is arranged on the direct current charging circuit and wherein the transducer determines the alternating current actuating variable as a function of a temperature detected by the temperature sensor.

8. The measuring transducer according to claim 1, wherein an alternating current variable is fed back to the transducer as an actuating variable.

9. The measuring transducer according to claim 1, wherein a scaling circuit scales the direct current measurement variable.

10. The measuring transducer according to claim 1, wherein the alternating current measuring circuit has a constant current source and wherein the constant current source feeds a constant alternating current into the alternating current measuring circuit as a function of the alternating current actuating variable.

11. The measuring transducer according to claim 10, wherein the constant current source has at least one resistor adjustable as a function of the alternating current actuating variable.

12. The measuring transducer according to claim 1, wherein a measuring device for detecting at least one alternating current measurement variable is arranged in the alternating current measuring circuit and wherein the alternating current measurement variable is fed back to the transducer as an actuating variable.

13. The measuring transducer according to claim 1, wherein the alternating current measuring circuit is a single-phase alternating current measuring circuit.

14. A method for operating a measuring transducer, in particular according to one of the above claims, comprising the steps of:
    measuring, in a direct current charging circuit, at least one direct current measurement variable;
    determining from the direct current measurement variable an alternating current actuating variable; and
    operating an alternating current circuit with an alternating current variable as a function of the alternating current actuating variable;
    wherein the alternating current circuit is an alternating current measuring circuit with alternating current measuring technology and wherein the active power in the alternating current measuring circuit is less by a constant factor than the power in the direct current charging circuit.

15. The method according to claim 14, wherein the alternating current measuring circuit has a mains connection and is operated with mains voltage, in particular with 110V AC or 230V AC.

16. The method according to claim 14, wherein the direct current measurement variable is detected at intervals, in particular at intervals of less than 1 second, preferably of less than 100 ms, in particular 10 ms.

* * * * *